(12) United States Patent (10) Patent No.: US 9,047,978 B2
Bell et al. (45) Date of Patent: Jun. 2, 2015

(54) APPARATUSES AND METHODS FOR SELECTIVE ROW REFRESHES

(71) Applicant: Micron Technology, Inc., Boise, ID (US)

(72) Inventors: Debra M. Bell, Dallas, TX (US); Jeff A. McClain, Nampa, ID (US); Brian P. Callaway, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 14/010,120

(22) Filed: Aug. 26, 2013

(65) Prior Publication Data

US 2015/0055420 A1 Feb. 26, 2015

(51) Int. Cl.
*G11C 7/00* (2006.01)
*G11C 11/406* (2006.01)
*G11C 7/10* (2006.01)

(52) U.S. Cl.
CPC ............ *G11C 11/406* (2013.01); *G11C 7/1012* (2013.01)

(58) Field of Classification Search
USPC .......................................... 365/222, 185.25
See application file for complete search history.

(56) References Cited

U.S. PATENT DOCUMENTS

| 6,061,290 | A | 5/2000 | Shirley |
| 7,057,960 | B1 * | 6/2006 | Fiscus et al. ................... 365/222 |
| 8,681,578 | B2 * | 3/2014 | Narui ............................. 365/222 |
| 2004/0114446 | A1 * | 6/2004 | Takahashi et al. ............ 365/222 |
| 2007/0030746 | A1 | 2/2007 | Best et al. |
| 2011/0069572 | A1 | 3/2011 | Lee et al. |
| 2012/0151131 | A1 | 6/2012 | Kilmer et al. |

OTHER PUBLICATIONS

International Search Report and Written Opinion for PCT/US2014/049357 mailed on Nov. 12, 2014.

* cited by examiner

*Primary Examiner* — Anthan Tran
(74) *Attorney, Agent, or Firm* — Dorsey & Whitney LLP

(57) ABSTRACT

Apparatuses and methods for selective row refreshes are disclosed herein. An example apparatus may include a refresh control circuit. The refresh control circuit may be configured to receive a target address associated with a target plurality of memory cells from an address bus. The refresh control circuit may further be configured to provide a proximate address to the address bus responsive, at least in part, to determining that a number of refresh operations have occurred. In some examples, a plurality of memory cells associated with the proximate address may be a plurality of memory cells adjacent the target plurality of memory cells.

26 Claims, 4 Drawing Sheets

APPARATUSES AND METHODS FOR SELECTIVE ROW REFRESHES

TECHNICAL FIELD

Embodiments of the present invention relate generally to semiconductor memory, and more specifically, in one or more described embodiments, to refreshing a row or rows of memory physically adjacent a target row of memory.

BACKGROUND

In current memory systems, data stored in volatile memories (e.g., DRAM) must be periodically refreshed to compensate for inherent leakage of capacitors in memory cells. In essence, refreshing includes, for example, reading data out of each row of memory and subsequently writing the data back to the same respective row. As a result, the original charge level on each capacitor is restored and data preserved.

While many approaches for using memory refreshes to compensate for leakage are well known in the art, these approaches have struggled when applied to the increasingly demanding operating speeds and applications of memories today. For example, in some instances, a particular row or rows of memory may be repeatedly accessed at a high frequency. Data stored by memory cells of rows physically adjacent the repeatedly accessed row of memory may be degraded before normal refresh operations are performed to preserve the data of those adjacent rows. That is, due to coupling effects, cell to cell leakage may increase, and the repetitive accesses may degrade data of rows physically adjacent the repetitively accessed row or rows.

DETAILED DESCRIPTION

Figure 1:
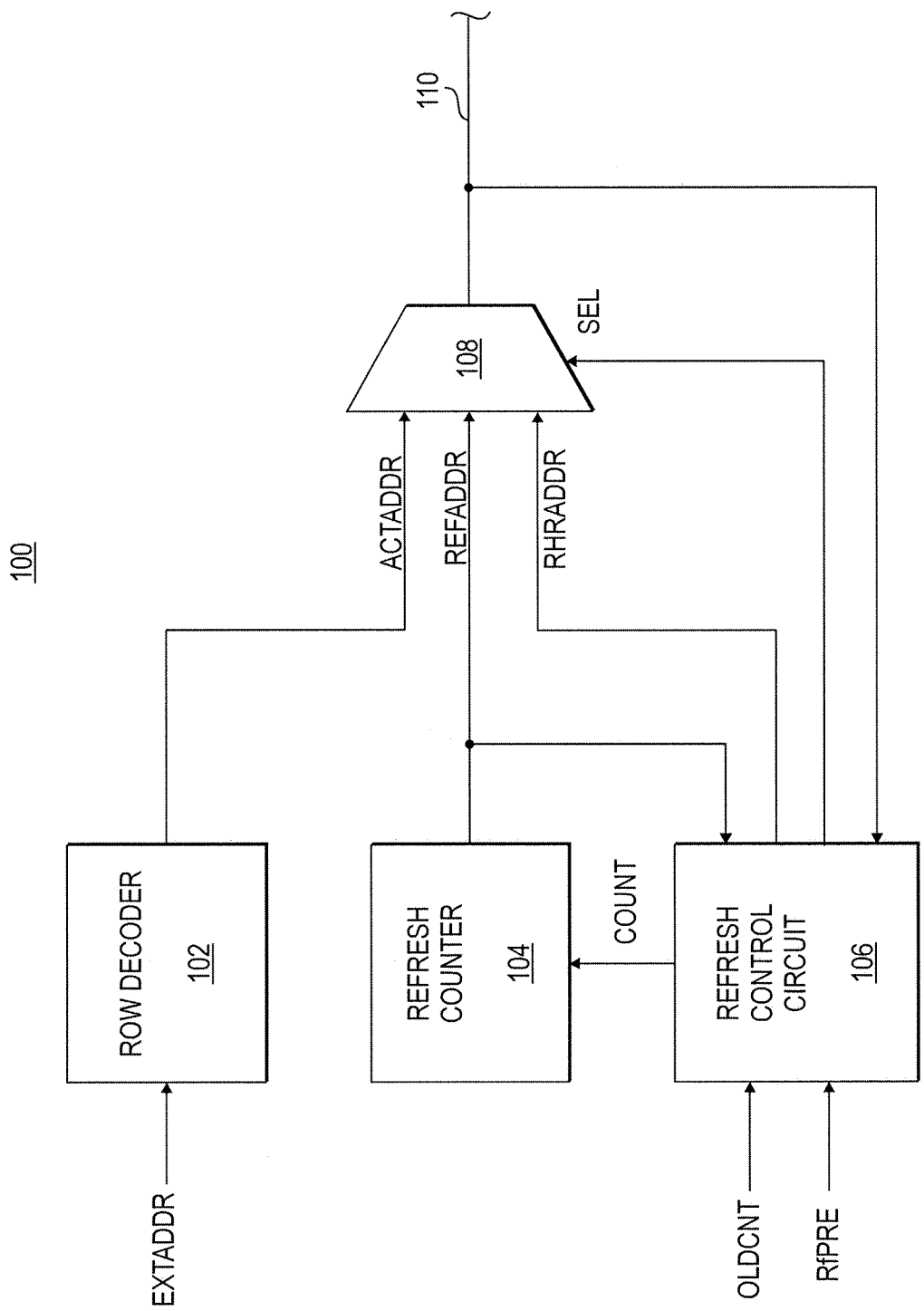
FIG. 1 is a block diagram of an apparatus according to an embodiment of the present invention.

Apparatuses and methods for selective row refreshes are disclosed herein. In accordance with one or more embodiments of the described invention, one or more rows physically adjacent a target row may be refreshed. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples of the present invention relate generally to memory operations. Typically, memories, such as DRAM, operate in accordance with at least three types of operations, read operations, write operations, and refresh operations. For each operation, an active command is provided to activate (e.g., open) a particular row, a respective operation is performed on the row, and a precharge command is provided to deactivate (e.g., close) the row.

Read and write operations may be performed using an externally generated address (e.g., external address), which may be decoded into a target address. For example, the external address and an active command may be provided to a memory, and in response a target row associated with the target address may be activated. When a subsequent read or write command is provided to the memory, the memory may read data from or write data to the target row accordingly. The target row may remain activated until a precharge command is received, whereupon the target row may be deactivated.

Refresh operations may be performed using an internally generated address (e.g., refresh address). For example, a refresh command may be provided to a memory and cause a row associated with a refresh address to be refreshed. When a subsequent refresh command is provided to the memory, a row associated with a new refresh address is refreshed. In many instances, a refresh address may be provided (e.g., generated) using a counter, and the counter may increment after each refresh operation such that rows may be refreshed sequentially. Moreover, rows of memory may be refreshed in several ways. Refresh operations may, for instance, be interleaved with other operations (e.g., read operations, write operations), allowing a memory to refresh rows as necessary, while prioritizing other operations. Typically, refresh operations are performed in bursts. For example, a plurality of refresh operations may be performed in succession between operations. Accordingly, in between various read and write operations, a memory may receive a plurality of successive refresh commands, with each refresh command causing a respective row to be refreshed.

FIG. 1 is a block diagram of an apparatus 100 according to an embodiment of the invention. The apparatus 100 may include a row decoder 102, a refresh counter 104, a refresh control circuit 106, a multiplexer 108, and an address bus 110.

The row decoder 102 may be coupled to the multiplexer 108 and configured to provide a target address ACTADDR to an input of the multiplexer 108, for instance, in response to decoding an external address EXTADDR. The external address EXTADDR may comprise an externally generated address and may be provided from an external device such as a controller (e.g., memory controller). The row associated with the target address ACTADDR may comprise a target row.

The refresh counter 104 may be coupled to the multiplexer 108 and configured to provide a refresh address REFADDR to an input of the multiplexer 108. In at least one embodiment, the refresh address REFADDR may be used to refresh a row associated with the refresh row address REFADDR in association with (e.g., before, prior to, during, after, in response to) a refresh operation. The refresh counter 104 may comprise a counter, such as a binary counter, and the refresh address REFADDR may comprise a count of the refresh counter 104. The refresh counter 104 may be configured to increment based, at least in part, on the control signal COUNT. In some examples, the refresh counter 104 may be configured to increment responsive, at least in part, to an edge (e.g., rising edge) of the control signal COUNT.

The refresh control circuit 106 may be coupled to the address bus 110 and configured to provide a proximate address RHRADDR to an input of the multiplexer 108. The proximate address RHRADDR may be based, at least in part, on an address, such as a target address ACTADDR provided by the multiplexer 108 via the address bus 110. In some examples, the refresh control circuit 106 may be configured to latch (e.g., store) the target address ACTADDR, for instance, in response to an active command associated with a read or write operation.

The refresh control circuit 106 may further be configured to provide the control signal SEL to the multiplexer 108. Based, at least in part, on the control signal SEL, the multiplexer 108 may selectively provide the target address ACTADDR received from the row decoder 102, the refresh address REFADDR received from the refresh counter 104, or the proximate address RHRADDR received from the refresh control circuit 106, to the address bus 110. By way of example, the refresh control circuit 106 may be configured to cause the multiplexer 108 to selectively provide the target address ACTADDR in association with read and write operations and to selectively provide the refresh address REFADDR in association with refresh operations. Accordingly, for a read operation or a write operation, data may be read from or written to a target row associated with the target address ACTADDR. For a refresh operation, a row associated with the refresh address REFADDR may be refreshed.

As will be described in more detail below, the refresh control circuit 106 may further be configured to cause the multiplexer 108 to selectively provide proximate addresses RHRADDR to the address bus 110 in association with respective interrupt operations. In some examples, providing proximate addresses RHRADDR in this manner may cause rows associated with the proximate addresses RHRADDR to be refreshed. In at least one embodiment, a proximate address RHRADDR may comprise an address associated with a row physically adjacent a target row, e.g., a row associated with a target address ACTADDR. In some examples, the refresh control circuit 106 may perform one or more interrupt operations after a particular number of refresh operations have been performed.

The refresh control circuit 106 may further be configured to receive a control signal OLDCNT. The control signal OLDCNT may be asserted, for instance by control logic (not shown in FIG. 1), each time a row is refreshed. For example, the control signal OLDCNT may be asserted when a refresh command is provided. Based, at least in part, on the control signal OLDCNT, the refresh control circuit 106 may selectively assert the control signal COUNT. As described, asserting the control signal COUNT may cause the refresh address REFADDR to be incremented. The refresh control circuit 106 may further be configured to receive a control signal RfPRE. The control signal RfPRE may be asserted, for instance by control logic (not shown in FIG. 1), each time a row is refreshed. For example, the control signal RfPRE may be asserted each time a row is precharged in association with a refresh operation.

In an example read operation or write operation of the apparatus 100, an active command and an external address EXTADDR may be provided. The row decoder 102 may decode the external address EXTADDR to provide a target address ACTADDR to the multiplexer 108, and the multiplexer 108 may selectively provide the target address ACTADDR to the address bus 110 based, at least in part, on the control signal SEL. A read or write operation may be performed, and data may be read from or written to the target row associated with the target address ACTADDR, respectively. The target row may subsequently be deactivated. The refresh control circuit 106 may receive and latch the target address ACTADDR for instance, responsive to the active command associated with the read operation or write operation.

Responsive, at least in part, to latching the output address ACTADDR, the refresh control circuit 106 may provide (e.g., generate) proximate addresses RHRADDR. As described, a proximate address RHRADDR may comprise an address associated with a row physically adjacent a target row. Thus providing proximate addresses RHRADDR may include providing addresses of rows physically adjacent the target row. By way of example, the refresh control circuit 106 may increment the target address ACTADDR to provide a first proximate address RHRADDR, and may decrement the target address ACTADDR to provide a second proximate address RHRADDR. In another example, the refresh control circuit 106 may increment or decrement the target address ACTADDR to provide a first proximate address RHRADDR. An exclusive OR (XOR) operation may be performed on the first proximate address RHRADDR and the target address ACTADDR to provide a second proximate address RHRADDR. The proximate row addresses RHRADDR may be provided after the target address ACTADDR has been latched, such as prior to and/or in association with an interrupt operation.

In an example refresh operation, a refresh command may be provided and the refresh control circuit 106 may cause the multiplexer 108 to selectively provide the refresh address REFADDR to the address bus 110. The row associated with the refresh address REFADDR may be refreshed, and the refresh address REFADDR may be incremented. As described, refresh operations may be performed in succession between other operations, such as read and write operations. Accordingly, subsequent refresh operations may be performed in response to respective refresh commands such that rows are refreshed sequentially.

After a particular number of rows have been refreshed, that is, after a particular number of refresh operations have been performed, the refresh control circuit 106 may perform an interrupt operation to refresh memory associated with a proximate address RHRADDR. Briefly, in association with an interrupt operation, a row associated with the proximate address RHRADDR may be refreshed. The refresh control circuit 106 may determine the number of rows refreshed based, at least in part, on the refresh address REFADDR, for instance, by determining that a particular bit of the refresh address REFADDR has transitioned from a first state to a second state (e.g., logic low to logic high). For example, a transition of a ninth least significant bit of a refresh address REFADDR that was incremented by one starting from zero may indicate that 256 rows have been refreshed.

Performing an interrupt operation may include the multiplexer 108 selectively providing a proximate address RHRADDR to the address bus 110. This may in turn cause the row associated with the proximate address RHRADDR to be refreshed. In one embodiment, interrupt operations may be performed consecutively until rows associated with a plurality of proximate addresses RHRADDR have been refreshed. In other embodiments, interrupt operations are not performed consecutively.

In at least one embodiment, the refresh control circuit 106 may be configured to perform an interrupt operation responsive, at least in part, to a refresh command. For example, once the refresh control circuit 106 has determined that a particular number of rows have been refreshed, the refresh control circuit 106 may perform an interrupt operation in response to a subsequent refresh command, or in response to each of a plurality of subsequent refresh commands for a plurality of proximate addresses RHRADDR. In response to each refresh command, the refresh control circuit 106 may provide a proximate address RHRADDR such that the row associated with the respective proximate address RHRADDR is refreshed.

In association with interrupt operations, the refresh control circuit 106 may not assert the control signal COUNT. In this manner, the refresh control circuit 106 may hold the refresh address REFADDR at a same value while a row associated with the proximate address RHRADDR is refreshed in association with the interrupt operation. Thus, after interrupt operations have completed, the refresh control circuit 106 may assert the control signal COUNT responsive to a subsequent refresh command so that the refresh counter 104 may resume providing addresses without "skipping" a refresh of a row as a result of an interrupt operation during which a row associated with a proximate address RHRADDR is refreshed.

As described, the refresh control circuit 106 may be configured to latch a target address ACTADDR. In at least one embodiment, the refresh control circuit 106 may be configured to latch the most recent target address ACTADDR such that the most recent address provided by the row decoder 102 is used to provide a proximate address RHRADDR, and therefore the row or rows refreshed in association with interrupt operations. In other embodiments, the refresh control circuit 106 may be configured to latch multiple target addresses ACTADDR. For example, the refresh control circuit 106 may be configured to latch (e.g., store) the previous four target addresses ACTADDR provided by the row decoder 102. Accordingly, interrupt operations may include refreshing rows physically adjacent one or more of the latched target addresses ACTADDR.

In some embodiments, the refresh control circuit 106 may further be configured to selectively perform refresh operations. For example, the refresh control circuit 106 may be configured to perform an interrupt operation to refresh a row if the row is functional. In this manner, accessing malfunctioning and/or damaged rows may be avoided. Moreover, if the target row is a boundary row (e.g., a row of primary memory physically adjacent a redundant portion or a row of redundant memory physically adjacent a primary portion), the refresh control circuit 106 may be configured to selectively perform an interrupt operation to refresh an adjacent row in a neighboring portion if the adjacent row is functional.

As described, if a target row is repeatedly accessed (e.g., in association with a read operation or a write operation), coupling effects may result in increased cell to cell leakage, and degradation of data stored in rows physically adjacent a repetitively accessed row. Accordingly, by refreshing rows associated with proximate addresses RHRADDR in association with refresh operations, the physically adjacent rows may be refreshed more frequently, thereby reducing degradation of the data stored by the adjacent rows. By latching the most recent target address, and subsequently refreshing the rows physically adjacent the target row associated with the target address, the physically adjacent rows may be refreshed without a need to determine a number of times a row is accessed within a particular period of time.

Figure 2:
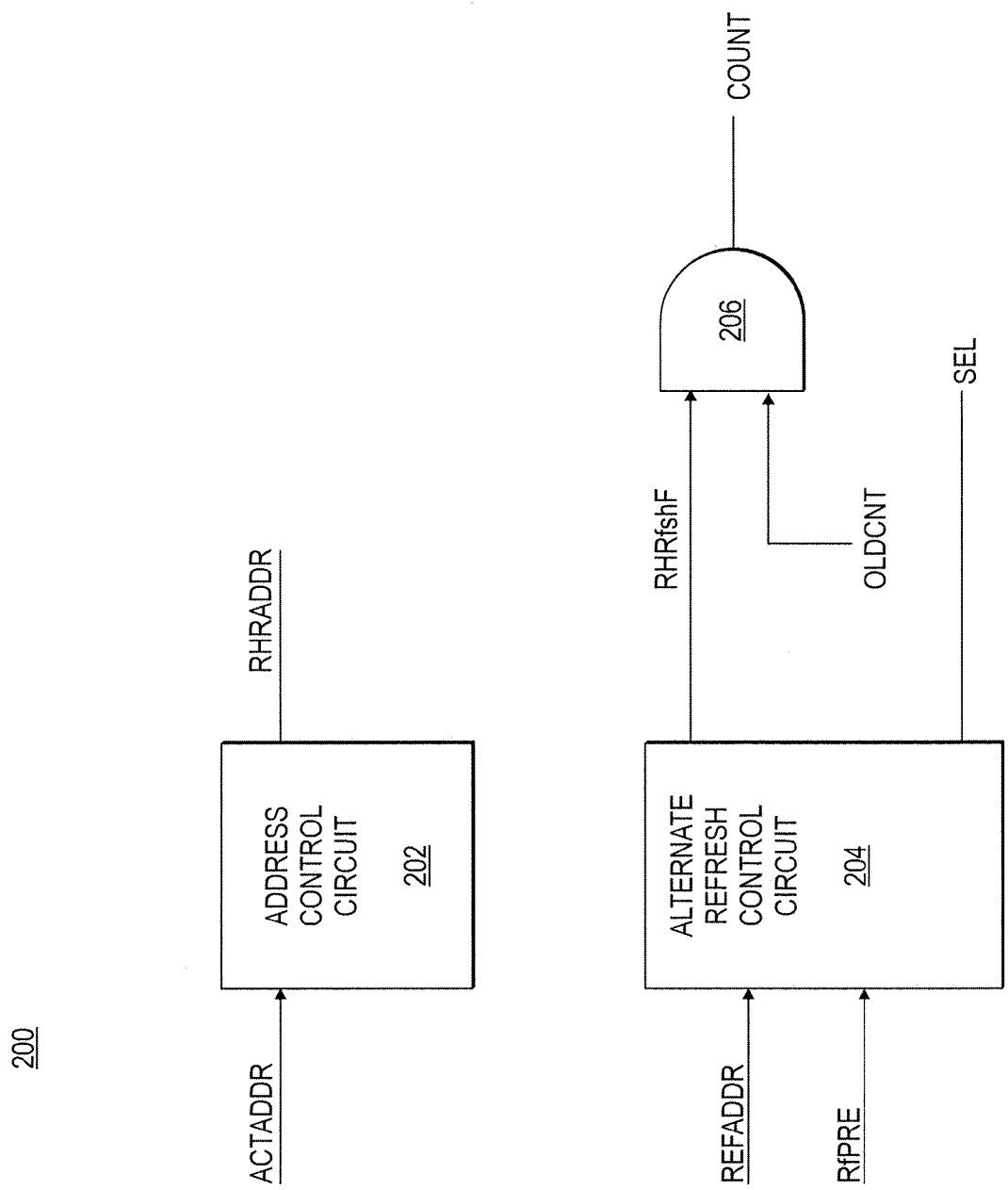
FIG. 2 is a schematic block diagram of a refresh control circuit according to an embodiment of the present invention.

FIG. 2 is a schematic block diagram of a refresh control circuit 200 according to an embodiment of the present invention. The refresh control circuit 200 may be used to implement the refresh control circuit 106 of FIG. 1. The refresh control circuit 200 may include an address control circuit 202, an alternate refresh control circuit 204, and an AND logic gate 206.

The address control circuit 202 may be configured to receive the target address ACTADDR and provide the proximate address RHRADDR. As described, the address control circuit 202 may provide one or more proximate addresses RHRADDR based, at least in part, on the target address ACTADDR. A proximate row addresses RHRADDR may be associated with a row physically adjacent a target row.

The alternate refresh control circuit 204 may be configured to receive the refresh row address REFADDR, for instance, from the refresh counter 104 of FIG. 1, and further may receive the control signal RfPRE. Based, at least in part, on the refresh row address REFADDR and the control signal RfPRE, the alternate refresh control circuit 204 may provide a control signal RHRfshF. The alternate refresh control circuit 204 may, for instance, assert the control signal RHRfshF in association with read and write operations and refresh operations.

The AND logic gate 206 may receive the control signal RHRfshF and the control signal OLDCNT. The control signal OLDCNT may be asserted in response to a row being refreshed, for instance in association with a refresh operation and/or an interrupt operation. Because the control signal RHRfshF may not be asserted during interrupt operations, however, the AND logic gate may assert the COUNT signal responsive to a row being refreshed in association with a refresh operation. In this manner, the refresh address REFADDR may be incremented responsive to refreshes associated with refresh operations, in contrast to refreshes associated with interrupt operations.

The alternate refresh control circuit 204 may further be configured to provide the control signal SEL and cause the multiplexer 108 of FIG. 1 to selectively provide the target address ACTADDR, the refresh address REFADDR, or the proximate address RHRADDR to the address bus 110 in association with read and write operations, refresh operations, and interrupt operations, respectively.

Figure 3:
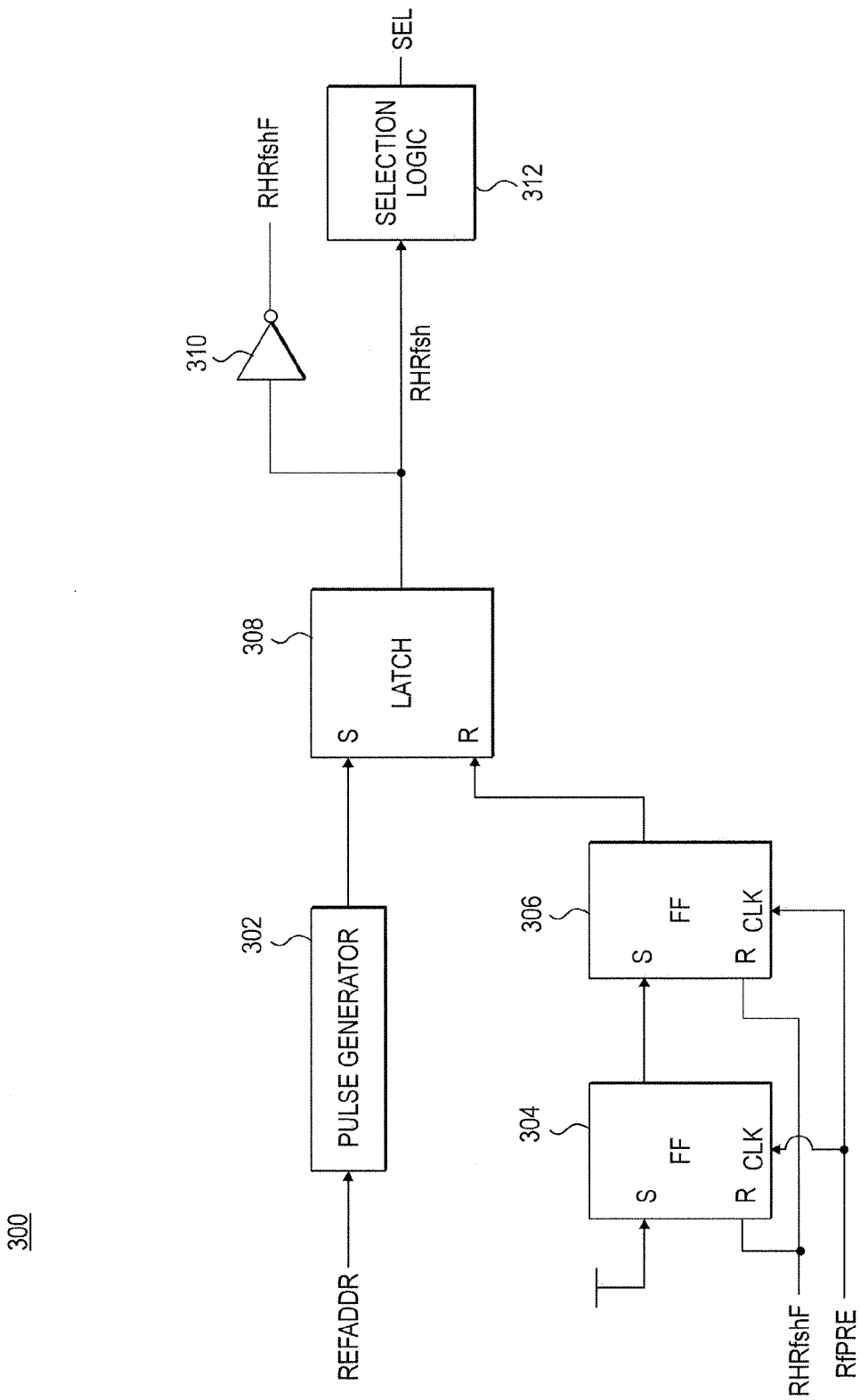
FIG. 3 is a schematic block diagram of an alternate refresh control circuit according to an embodiment of the present invention.

FIG. 3 is a schematic block diagram of an alternate refresh control circuit 300 according to an embodiment of the present invention. The alternate refresh control circuit 300 may be used to implement the alternate refresh control circuit 204 of FIG. 2. The alternate refresh control circuit 300 may include a pulse generator 302, flip-flops 304, 306, a set-reset (SR) latch 308, an inverter 310, and selection logic 312.

The pulse generator 302 may be configured to receive the refresh address REFADDR, for instance, from the refresh counter 104 of FIG. 1. Based, at least in part, on the refresh address REFADDR, the pulse generator 302 may provide a pulse to the SR latch 308. In some examples, the pulse generator 302 may be configured to provide a pulse responsive to determining that a particular number of refresh operations have been performed. This may, for instance, include determining that a particular bit of the refresh address REFADDR has transitioned from a first state to a second state. The flip-flops 304, 306 may be configured to receive the control signals RHRfshF and RfPRE at reset R and clock CLK inputs, respectively. The flip-flop 304 may be configured to receive a logic high supply voltage at its data S input.

The SR latch 308 may be configured to receive pulses from the pulse generator at a first S input and to receive the output of the flip-flop 306 at a second R input. The SR latch 308 may be configured to provide a control signal RHRfsh. The control signal RHRfsh may be received by the inverter 310 and inverted to provide the control signal RHRfshF.

The selection logic 312 may be configured to receive the control signal RHRfsh and provide the control signal SEL. As previously described, the control signal SEL may be provided to the multiplexer 108 of FIG. 1 to cause the multiplexer 108 to selectively provide the target address ACTADDR, the refresh address REFADDR, or the proximate address RHRADDR to an address bus, such as the address bus 110 of FIG. 1. The selection logic 312 may be configured to cause the multiplexer 108 to provide proximate addresses RHRADDR responsive the control signal RHRfsh being asserted.

In an example operation, the pulse generator 302 may determine that a particular number of refresh operations have been performed, for example, that a particular bit of the refresh address REFADDR has transitioned between states. As a result, the pulse generator 302 may provide a pulse to the SR latch 308.

In response, the SR latch 308 may provide an asserted control signal RHRfsh and the selection logic 312 may in turn cause the multiplexer 108 to provide a first proximate address RHRADDR to the address bus 110 in association with a first interrupt operation. As a result, a row associated with the proximate row address RHRADDR may be refreshed. Concurrently, the inverter 310 may invert the asserted control signal RHRfsh to provide the control signal RHRfshF. The control signal RHRfshF may not be asserted and thereby not cause the flip-flops 304, 306 to reset.

After the row associated with the first proximate row address RHRADDR is refreshed, the control signal RfPRE may be asserted and cause the flip-flops 304, 306 to clock such that the output of the flip-flop 304 transitions to a logic high level. A second proximate row address RHRADDR may be provided in association with a second interrupt operation and a row associated with the second proximate row address RHRADDR may be refreshed. After the row is refreshed, the control signal RfPRE may once again be asserted and cause the flip-flops 304, 306 to clock such that the output of the flip-flop 306 transitions to a logic high level. This may in turn cause the SR latch 308 to reset and cease asserting the control signal RHRfsh. The flip-flops 304, 306 may return to the reset state responsive to the control signal RHRfshF, and the selection logic 312 may cause the multiplexer 108 to selectively provide the refresh row address REFADDR to the address bus 110 such that refresh operations may resume. The first and second proximate row addresses RHRADDR may be associated with two rows adjacent a latched target row address. Refreshing the two adjacent rows in association with the first and second interrupt operations may prevent data stored by memory cells of the two adjacent rows from being degraded by repeated accesses of the row associated with the latched target row address.

In some examples, refreshing a row may include refreshing a plurality of memory cells. Moreover, a plurality of memory cells may comprise either a row of memory cells and/or a column of memory cells. Accordingly, although examples described herein are directed to selective row refreshes, it will be appreciated that described examples may be applied to memory cells such that selective column refreshes may be performed as well. In this manner, embodiments described herein may be applied to refresh a plurality of memory cells configured in any arrangement, such as in a row, column, fat row (e.g., multiple rows), fat column (multiple columns), or combination thereof.

Figure 4:
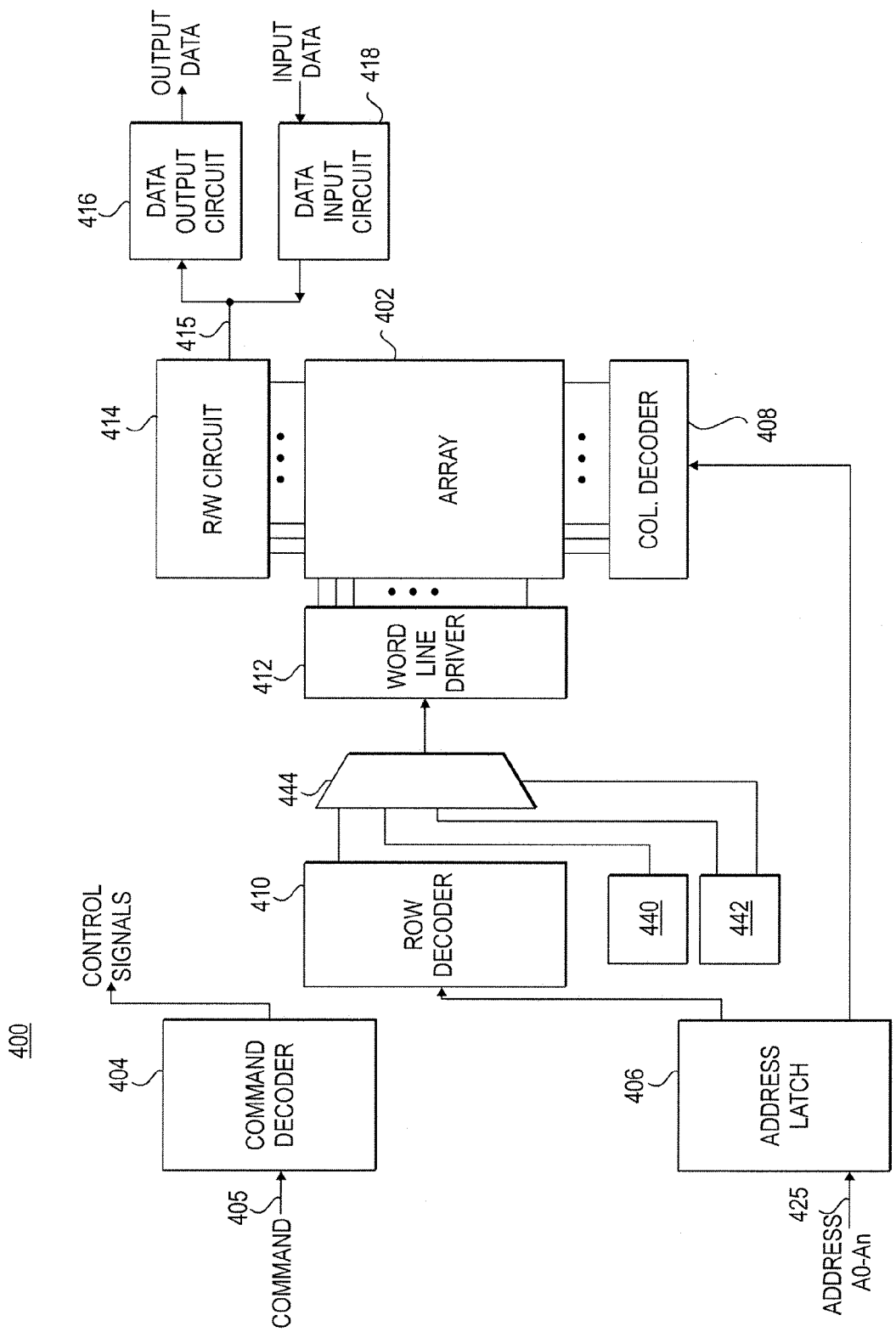
FIG. 4 is a block diagram of a memory including an apparatus according to an embodiment of the invention.

FIG. 4 is a block diagram of a memory 400 including an apparatus according to an embodiment of the invention. The memory 400 includes an array 402 of memory cells, which may be, for example, volatile memory cells, non-volatile memory cells, DRAM memory cells, SRAM memory cells, flash memory cells, or other types of memory cells. The memory 400 includes a command decoder 406 that receives memory commands and addresses through an ADDR/CMD bus. The command decoder 404 provides control signals, based on the commands received through the command bus 405. The command decoder 404 also provides row and column addresses to the memory 400 through an address bus 425 and an address latch 406. The address latch then outputs separate column addresses and separate row addresses.

The row and column addresses are provided by the address latch 406 to a row decoder 410 and a column decoder 408, respectively. The row decoder may comprise a row decoder described herein, such as the row decoder 102 of FIG. 1. The column decoder 408 selects bit lines extending through the array 402 corresponding to respective column addresses. The row decoder 410 is coupled to a multiplexer 444, which may comprise any multiplexer described herein, such as the multiplexer 108 of FIG. 1. A refresh counter 440 and a refresh control circuit 442 according to an embodiment of the invention may further be coupled to the multiplexer 444. For example, the refresh counter 440 and the refresh control circuit 442 may comprise a refresh counter and refresh control circuit described herein. The multiplexer 444 may be coupled to word line driver 424 that activates respective rows of memory cells in the array 402 corresponding to received row addresses. The selected data line (e.g., a bit line or bit lines) corresponding to a received column address is coupled to a read/write circuitry 414 to provide read data to a data output circuit 416 via an input-output data bus 415. Write data are provided to the array 402 through a data input circuit 418 and the memory array read/write circuitry 414. The command decoder 404 responds to memory commands and addresses provided to the command bus to perform various operations on the array 402. In particular, the command decoder 404 is used to provide control signals to read data from and write data to the array 402.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a refresh control circuit configured to receive a target address associated with a target plurality of memory cells from an address bus, the refresh control circuit further configured to provide a proximate address to the address bus responsive, at least in part, to determining that a number of refresh operations have occurred,
wherein a plurality of memory cells associated with the proximate address comprise a plurality of memory cells proximate the target plurality of memory cells.

2. The apparatus of claim 1, wherein the proximate address is a first proximate address and the plurality of memory cells proximate the target plurality of memory cells is a first plurality of memory cells adjacent the target plurality of memory cells,
wherein the refresh control circuit is further configured to provide a second proximate address to the address bus,
wherein the second proximate address is associated with a second plurality of memory cells adjacent the target plurality of memory cells different from the first plurality of memory cells adjacent the target plurality of memory cells.

3. The apparatus of claim 2, wherein the refresh control circuit is further configured to provide the second proximate address to the address bus responsive, at least in part, to performing an exclusive OR operation on the target address and the first proximate address.

4. The apparatus of claim 1, wherein the refresh control circuit is further configured to determine that the number of refresh operations have occurred based, at least in part, on a bit of a refresh address.

5. The apparatus of claim 1, wherein the refresh control circuit is further configured to determine whether the plurality of memory cells proximate the target plurality of memory cells is functional.

6. The apparatus of claim 1, wherein the refresh control circuit is further configured to latch the target address responsive, at least in part, to an active command.

7. The apparatus of claim 1, wherein the apparatus is included in a memory.

8. An apparatus, comprising:
an address bus;
a multiplexer coupled to the address bus and configured to provide a target address to the address bus in association with an operation of a first type, to provide a refresh address to the address bus in association with an operation of a second type, and to provide a proximate address in association with an operation of a third type; and
a refresh control circuit configured to receive the target address from the address bus in association with the operation of the first type, the refresh control circuit further configured to provide the proximate address to the multiplexer in association with the operation of the third type, the proximate address based at least in part, on the target address.

9. The apparatus of claim 8, wherein the operation of the first type comprises at least one of a read operation or a write operation, and the operation of a second type comprises a refresh operation.

10. The apparatus of claim 9, wherein the operation of the third type comprises an interrupt operation.

11. The apparatus of claim 8, wherein the operation of a third type is a first operation of the third type and the proximate address is a first proximate address, the refresh control circuit configured to provide a second proximate address in association with a second operation of the third type.

12. The apparatus of claim 11, wherein the first and second proximate addresses are associated with respective pluralities of memory cells adjacent a target plurality of memory cells associated with the target address and wherein the refresh control circuit is further configured to provide the first and second proximate addresses to the multiplexer responsive to successive refresh commands.

13. The apparatus of claim 8, wherein the refresh control circuit is further configured to provide a control signal to the multiplexer, the multiplexer configured to selectively provide the target address to the address bus in association with the operation of a first type, selectively provide the refresh address to the address bus in association with the operation of the second type, and selectively provide the proximate address in association with the operation of the third type based, at least in part, on the control signal.

14. An apparatus, comprising:
a refresh counter configured to provide a refresh address; and
a refresh control circuit coupled to the refresh counter and configured to receive the refresh address and latch a target address, the refresh control circuit further configured to provide a proximate address responsive, at least in part, to determining a bit of the refresh address has a particular state,
wherein the target address is associated with a first plurality of memory cells and the proximate address is associated with a second plurality of memory cells adjacent the first plurality of memory cells.

15. The apparatus of claim 14, wherein the refresh control circuit is further configured to provide the proximate address responsive, at least in part, to a refresh command.

16. The apparatus of claim 14, wherein the refresh control circuit is further configured to latch the target address responsive, at least in part, to an active command.

17. The apparatus of claim 14, wherein the target address comprises a most recent target address provided by a row decoder.

18. The apparatus of claim 14, wherein the refresh control circuit comprises:
an address control circuit configured to receive the target address and provide proximate address based, at least in pan, on the target address;
an alternate refresh control circuit configured to receive the refresh address and a first control signal, the alternate refresh control circuit further configured to assert a second control signal in association with read and write operations and refresh operations; and
a logic gate configured to receive the second control signal from the alternate refresh control circuit and assert a third control signal to control a refresh counter to hold the value of the refresh address.

19. The apparatus of claim 18, wherein the alternate refresh control circuit comprises:
a pulse generator configured to receive the refresh address and provide a pulse responsive to determining that a number of refresh operations have been performed;
first and second flip flops configured to be clocked by the first control signal and the second flip flop configured to provide an output signal responsive to the first control signal;
a latch configured to receive the pulse and the output signal and provide the second control signal; and
selection logic configured to receive the second control signal and provide a fourth control signal to the multiplexer.

20. A method, comprising:
selectively providing a target address associated with a target plurality of memory cells to an address bus;
latching the target address; and
selectively providing a proximate address associated with a plurality of memory cells adjacent the target plurality of memory cells to the address bus responsive, at least in part, to determining a particular number of refresh operations have occurred.

21. The method of claim 20, wherein determining a particular number of refresh operations have occurred comprises determining a state of a bit of a refresh address.

22. The method of claim 20, further comprising:
selectively providing a refresh address to the address bus; and
incrementing the refresh address.

23. The method of claim 20, wherein providing the proximate address associated with a plurality of memory cells adjacent the target plurality of memory cells comprises incrementing the target address.

24. A method, comprising:
latching a target address associated with a target plurality of memory cells;
generating a plurality of proximate addresses based, at least in part, on the target address, each of the plurality of proximate addresses associated with a respective plurality of memory cells adjacent the target plurality of memory cells;
determining whether a number of refresh operations have occurred; and
if the number of refresh operations have occurred, providing each of the plurality of proximate addresses to an address bus responsive, at least in part, to respective refresh commands.

25. The method of claim 24, wherein determining whether a number of refresh operations have occurred comprises:

receiving a refresh address; and providing a pulse responsive, at least in part, to a bit of the refresh address transitioning from a first state to a second state.

26. The method of claim 24, wherein providing each of the plurality of proximate address to an address bus responsive, at least in part, to respective refresh commands comprises not asserting a count control signal.

\* \* \* \* \*